United States Patent
Masumoto (10) Patent No.: US 7,459,339 B2
(45) Date of Patent: Dec. 2, 2008

(54) FLIP-CHIP SEMICONDUCTOR DEVICE MANUFACTURING METHOD

(75) Inventor: Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 11/538,626

(22) Filed: Oct. 4, 2006

(65) Prior Publication Data

US 2007/0117264 A1 May 24, 2007

(30) Foreign Application Priority Data

Oct. 6, 2005 (JP) ............................. 2005-293509

(51) Int. Cl.
  H01L 21/44 (2006.01)
  H01L 21/48 (2006.01)
  H01L 21/50 (2006.01)
(52) U.S. Cl. ................ 438/106; 438/108; 257/E21.499
(58) Field of Classification Search ................. 438/106, 438/108, 112; 257/777, E21.499
See application file for complete search history.

(56) References Cited

U.S. PATENT DOCUMENTS 6,841,883 B1 * 1/2005 Farnworth et al. .......... 257/777
7,319,049 B2 * 1/2008 Oi et al. ...................... 438/106

* cited by examiner

*Primary Examiner*—Hoai v Pham
(74) *Attorney, Agent, or Firm*—Yingsheng Tung; Wade James Brady, III; Frederick J. Telecky, Jr.

(57) ABSTRACT

The objective of the invention is to provide a semiconductor device manufacturing method that can suppress the formation of voids in the underfill resin and realize a highly reliable flip-chip assembly. The semiconductor device manufacturing method pertaining to the present invention comprises the following processing steps: a step of operation in which a plurality of electrodes 24, formed in a two-dimensional array on a principal surface 22 of semiconductor chip 20, are connected to corresponding conductive regions 32, 34 on substrate 30, a step of operation in which underfill resin 40 is supplied between the principal surface of the semiconductor chip and the substrate, and a step of operation in which the semiconductor chip and substrate with supplied underfill resin 40 are exposed to atmospheric pressure.

14 Claims, 7 Drawing Sheets

FLIP-CHIP SEMICONDUCTOR DEVICE MANUFACTURING METHOD

FIELD OF THE INVENTION

The present invention pertains to a semiconductor device manufacturing method. More specifically, the present invention pertains to the technology in which the underfill resin is injected between the semiconductor chip of a flip-chip assembly and the substrate.

BACKGROUND OF THE INVENTION

Accompanying the demands for smaller size and operational improvements in cell phones, portable computers, and other electronic devices, there has been a demand for higher integration levels and smaller semiconductor chips that are used in these electronic devices. The flip-chip assembly that connects a bare chip to a substrate is one technology used in the assembly of semiconductor chips with a high integration level and smaller pitch. In the flip-chip assembly, the bump electrodes formed on the principal surface of the integrated circuit of the semiconductor chip are directly connected opposite the electrodes or lands on the substrate. This flip-chip assembly method is replacing the method of connecting the electrodes on the semiconductor chip to the substrate by means of wire bonding.

The flip-chip assembly adopts the following methods: the method in which a bare chip on which bumps have been formed is pressed and bonded to a substrate on which an anisotropic conductive film has been laminated, and the method in which a bare chip on which solder bumps have been formed is mounted on a substrate, and connections are formed by reflow soldering. In the latter method of connection, in order to prevent breakage due to the concentration of stress on the solder bumps, an underfill resin is injected between the bare chip and the substrate so as to relieve the stress.

Patent Reference 1 pertains to a semiconductor device manufacturing method in which an underfill resin is injected. In this method, in order to solve the problem that when liquid underfill resin is injected from an end portion of the semiconductor chip, the resin will creep to the upper surface (a principal surface) of the semiconductor chip and will become attached to the upper surface, the upper surface of the semiconductor chip is subjected to plasma treatment after sealing the underfill resin. As a result, the heat sink can be easily connected to the upper surface of the semiconductor chip, so that the heat dissipation property is improved.

When the liquid underfill resin is injected into the space between the semiconductor chip and the substrate while the semiconductor chip and the substrate are in the flip-chip connection state, the underfill resin moves deep into this space due to capillary action to seal the solder bumps between the semiconductor chip and the substrate.

However, for certain reasons, the underfill resin cannot penetrate to the vicinity of the center of the semiconductor chip as it should, and air bubbles or other voids form in the resin. One reason concerns the effect of the physical size and shape of the semiconductor chip and substrate. For example, as the pitch of the electrodes of the semiconductor chip and the bumps becomes as small as 50 µm, or the number of the electrodes approaches 400, or the spacing between the semiconductor chip and the substrate becomes 15 µm or smaller, the propagation resistance of the resin increases, so that it is difficult for the resin to penetrate deeply, and voids are formed. As numerous voids form in the resin, the ability of the resin to relax the stress is reduced, and bonds to the solder bumps may break. Also, protection from water content and moisture from the outside will be insufficient.

The purpose of the present invention is to solve the aforementioned problems of the prior art by providing a semiconductor device manufacturing method that can suppress the formation of voids in the underfill resin, so that a highly reliable flip-chip assembly can be realized.

SUMMARY OF THE INVENTION

The present invention provides a semiconductor device manufacturing method characterized by the fact that it comprises the following processing steps: (a) a step of operation in which a plurality of electrodes, arranged in a two-dimensional array on a principal surface of a semiconductor chip, are connected to the corresponding conductive regions on the substrate; (b) a step of operation in which an underfill resin is supplied between the principal surface of the semiconductor chip and the substrate in a vacuum atmosphere; (c) a step of operation in which the semiconductor chip and substrate with said supplied underfill resin are exposed to atmospheric pressure.

In addition, the manufacturing method also comprises a step of operation in which the substrate connected to the semiconductor chip is placed in a vacuum chamber with a vacuum level of 1 torr. It is preferred that the underfill resin be supplied in the vacuum chamber, and that the liquefied resin be supplied or injected into the side surface or near the end portion of the semiconductor chip on the substrate. After the underfill resin is kept under vacuum for a prescribed period, it is exposed to atmospheric pressure for about 10 sec inside the vacuum chamber.

It is preferred that the underfill resin be an epoxy resin, and that the epoxy resin be supplied after being heated to about 80-110° C. For example, the viscosity of the epoxy resin is about 0.2 Pa?s or lower, which is appropriate for a flip-chip assembly where the spacing between the principal surface of the semiconductor chip and the substrate is 15 µm or less, and the pitch of the electrodes is 50 µm or less. The electrodes of the semiconductor chip may be gold-plated bumps or gold stud bumps, or solder bumps, or Au, Sn or Ag. Also, bumps may be formed on the conductive regions of the substrate.

In addition, the present invention provides a semiconductor device manufacturing method characterized by the fact that it comprises the following processing steps: (a) a step of operation in which a plurality of electrodes, arranged in a two-dimensional array on a principal surface of a semiconductor package, are connected to corresponding conductive regions on the substrate; (b) a step of operation in which an underfill resin is supplied between the principal surface of the semiconductor package and the substrate in a vacuum atmosphere; (c) a step of operation in which the semiconductor package and substrate with said supplied underfill resin are exposed to atmospheric pressure.

Also, the present invention provides a semiconductor device manufacturing method characterized by the fact that it comprises the following processing steps: (a) a step of operation in which a plurality of electrodes, arranged in a two-dimensional array on a principal surface of a first semiconductor package, are connected to corresponding conductive regions on a principal surface of a second semiconductor package; (b) a step of operation in which an underfill resin is supplied between a principal surface of the first semiconductor package and a principal surface of the second semiconductor package in a vacuum atmosphere; (c) a step of operation in which the first and second semiconductor packages with said underfill resin are exposed to atmospheric pressure.

REFERENCE NUMERALS AND SYMBOLS AS SHOWN IN THE DRAWINGS

In the figures, 10 represents a semiconductor device, 20 represents a semiconductor chip, 22 represents a principal surface, 24 represents an electrode, 26 represents a bump, 30 represents a substrate, 32 represents an electrode, 34 represents a solder bump, 36 represents an internal wiring, 38 represents an external electrode, 100 represents a manufacturing device, 110 represents a loader, 120 represents a flip-chip stage, 130 represents an underfilling stage, 132 represents a vacuum chamber, 134 represents an injection element, 136 represents an underfill resin, 200 represents a semiconductor package, 210 represents a substrate, 220 represents an underfill resin, 300 represents a first semiconductor package, 400 represents a second semiconductor package, and 420 represents an underfill resin,

DESCRIPTION OF EMBODIMENTS

In accordance with the semiconductor device manufacturing method of the present invention, the underfill resin is supplied in a vacuum atmosphere, so that air bubbles, one source of voids, can be primarily eliminated. In addition, after the underfill resin is supplied, the semiconductor chip and substrate are exposed to the atmosphere, so that capillary action will cause the underfill resin to penetrate deeply into the space between the chip and the substrate. The generation of voids in the underfill resin that fills the space between the semiconductor chip and the substrate can thereby be minimized. As a result, it is possible to improve the bonding reliability of the electrodes of the flip-chip assembly. Similarly, when a flip-chip connection is formed on the substrate for a BGA or CSP semiconductor package, or when the semiconductor packages are POP (package-on-package) connected, the present invention can also be used.

A preferred embodiment of the present invention will be explained in detail below with reference to the attached figures. It should be noted that the size and shape described with reference to the figure may not be the same as those of the actual product.

Figure 1A:
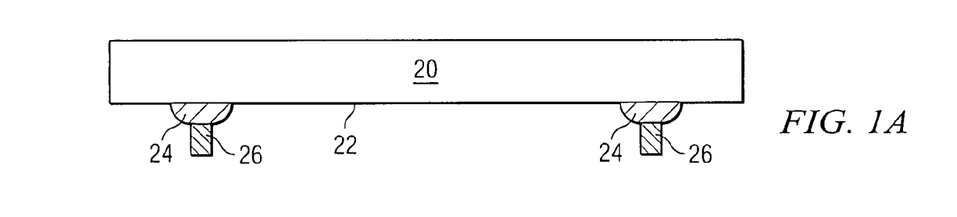
FIG. 1 is a cross-sectional view illustrating the semiconductor device of a flip-chip assembly prepared using the manufacturing method in an embodiment of the present invention.
Figure 1B:
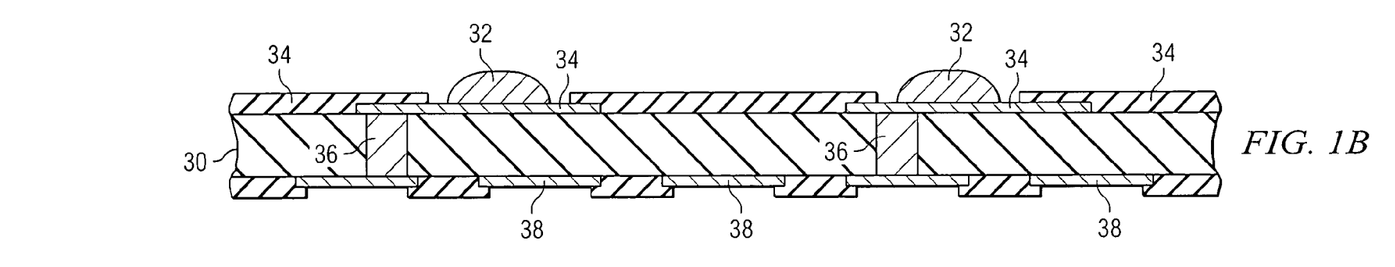
Figure 1C:
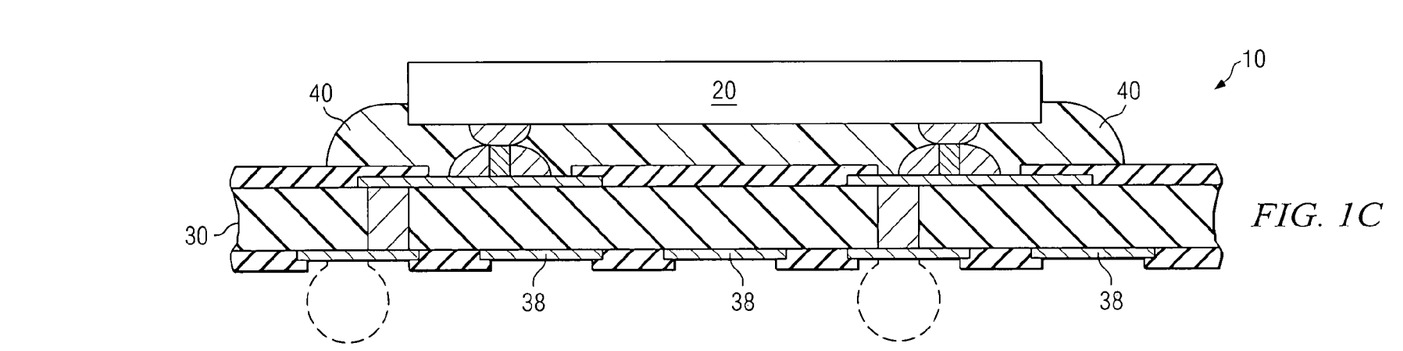

FIG. 1 is a cross-sectional view illustrating the constitution of an embodiment of a semiconductor device formed using the manufacturing method of the present invention. Semiconductor device 10 has semiconductor chip 20 and substrate 30 on which semiconductor chip 20 is assembled. On principal surface 22 as the integrated circuit surface of semiconductor chip 20, a plurality of electrode pads 24 made of aluminum or the like are arranged in a two-dimensional array. Bumps 26 are connected to electrode pads 24. For example, bumps 26, such as Au bumps, have a diameter of about 35 μm, and 440 electrode pads 24 are arranged in a configuration with a pitch of 50 μm.

Cu or other electrodes 32 are formed on the upper surface of substrate 30, and solder bumps 34 are formed on electrodes 32. Said solder bumps 34 are set at the positions corresponding to electrode pads 24 or bumps 26 of semiconductor chip 20. Said electrodes 32 are connected via internal wiring 36 of substrate 30 to external electrodes 38 formed on the inner surface of the substrate. Solder balls for BGA or CSP can be connected to external electrodes 38.

Said bumps 26 of semiconductor chip 20 are connected to solder bumps 34 of substrate 30, and bumps 26 and solder bumps 34 are eutectically bonded by means of reflow soldering. The state of the connection between bumps 26 and solder bumps 34 is brittle, so underfill resin 40 is used to reinforce the connections and is injected into the spacing between principal surface 22 of semiconductor chip 20 and substrate 30.

The spacing between semiconductor chip 20 and substrate 30 is preferably 15 μm or less, or more preferably, 7 μm. An epoxy resin, such as Namix U8437-48, which has a low viscosity at a constant temperature, may be used as underfill resin 40.

Figure 2:
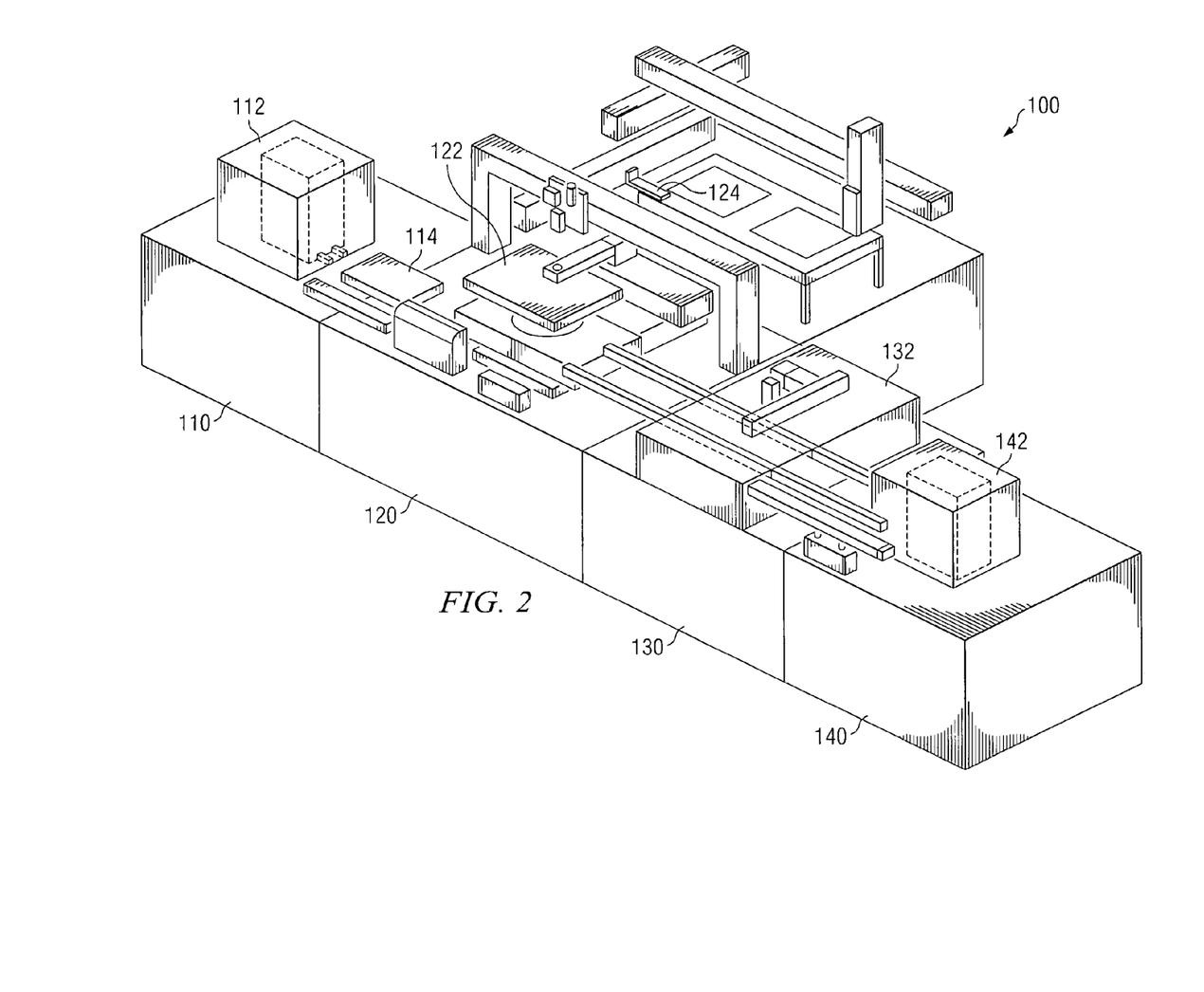
FIG. 2 is an oblique view of a semiconductor manufacturing apparatus for performing flip-chip assembly.

In the following, an explanation will be given regarding the semiconductor device manufacturing method of the present invention. FIG. 2 is an oblique view schematically illustrating the constitution of the semiconductor manufacturing device for flip-chip assembly. This manufacturing device 100 is composed of loader 110 that accommodates a plurality of substrates, flip-chip stage 120 for flip-chip assembly of the semiconductor chip, underfilling stage 130 for injecting the underfill resin onto the substrate of the flip-chip assembly, and unloader stage 140 that accommodates a plurality of substrates for which flip-chip assembly has been completed.

Said loader 110 contains loader 112 that contains a plurality of substrates 30 stacked vertically. Said loader 112 is heated with a heater (not shown in the figure) to a prescribed temperature. The temperature of substrate 30 removed from loader 112 is adjusted by preheating stage 114; the substrate is then transported to flip-chip stage 120.

Then, substrate 30 is carried on heat block 122, and heat block 122 keeps substrate 30 at the temperature required for assembly of the flip-chip. Semiconductor chip 20, which has been removed from chip tray changer 124 by a chip mounter, is positioned above substrate 30 and set in place. Bumps 26 of semiconductor chip 20 that has been set in place are bonded to electrodes 32 of substrate 30.

The substrate on which the flip chip is assembled is transported by a transporting belt or the like from the inlet port of vacuum chamber 132 to the interior, and it is positioned at the prescribed location. Then, the underfill resin is injected onto the substrate of the flip-chip assembly in vacuum chamber 132. After the prescribed time required for filling the spacing between the substrate and the semiconductor chip with the underfill resin, the outlet port of the vacuum chamber is opened, and the interior of the vacuum chamber is exposed to atmospheric pressure. Substrate 30 is then removed from vacuum chamber 132 and placed on unloader stage 140.

Figure 3:
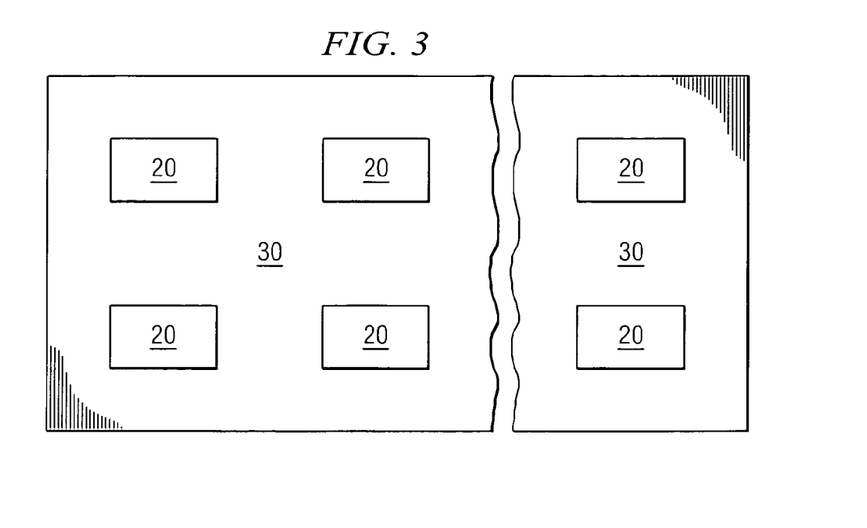
FIG. 3 is a plan view of the substrate placed in a vacuum chamber.

The method with which the underfill resin is supplied under vacuum will be explained in detail below. FIG. 3 is a plan view of the substrate set in vacuum chamber 132. On substrate 30, a plurality of semiconductor chips 20 are arranged in two-dimensional configuration in the flip-chip connection state. After substrate 30 has been placed in vacuum chamber 132, the vacuum level is brought to about 1 torr over a period of about 1 min.

Figure 4:
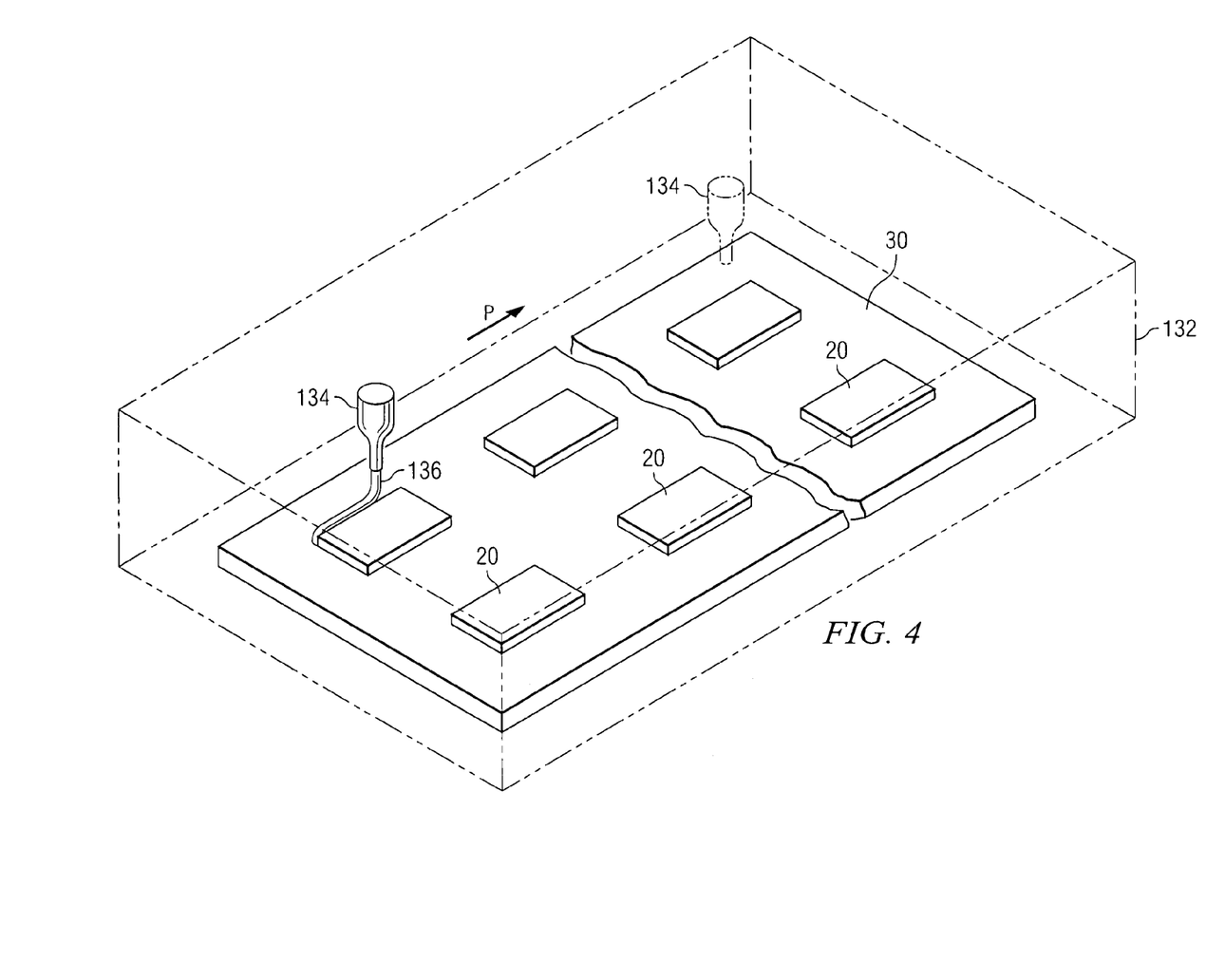
FIG. 4 is a diagram illustrating the supplying of the underfill resin to the substrate.

After the desired vacuum level has been reached, as shown in FIG. 4, injection element 134 is used to start the supply of underfill resin 136. Said injection element 134 can be driven to move in vacuum chamber 132, and underfill resin 136 is supplied to each of the plurality of semiconductor chips assembled on the substrate. In the example shown in the figure, while injection element 134 is driven to move in scanning direction P, the underfill resin is supplied to each semiconductor chip 20.

Figure 5:
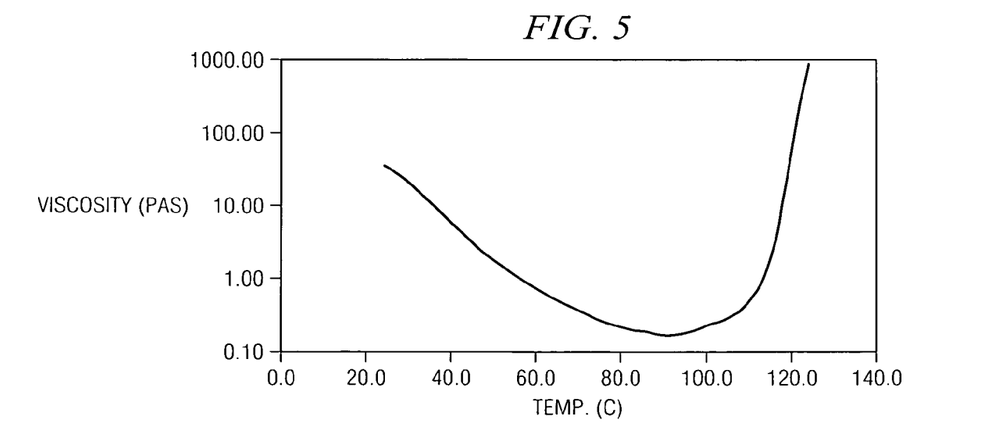
FIG. 5 is a graph illustrating the characteristics of the underfill resin.

An epoxy resin (Namix U8437-48) is preferably used as the underfill resin. FIG. 5 is a graph illustrating the characteristics of the epoxy resin. In this figure, the abscissa represents temperature, and the ordinate represents viscosity (Pa?s). As can be seen from the graph, there is an inflection point for the lowest viscosity of the epoxy resin at about 90° C. Consequently, the temperature inside vacuum chamber 132 is adjusted so that the temperature of the epoxy resin injected inside vacuum chamber 132 is about 80-100° C. The temperature of injection element 134 may also be adjusted. When the viscosity of the epoxy resin reaches about 0.5 (Pa?s) or less at about 80-100° C., e.g., the epoxy resin can then flow smoothly even into the narrow spacing of the semiconductor chips with a narrow pitch.

Figure 6A:
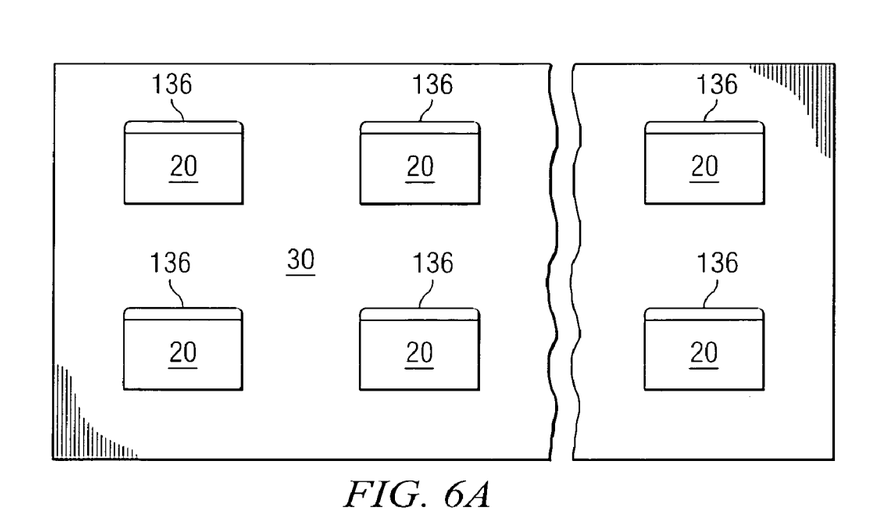
FIG. 6 is a diagram illustrating the injection pattern of the underfill resin on the substrate.
Figure 6B:
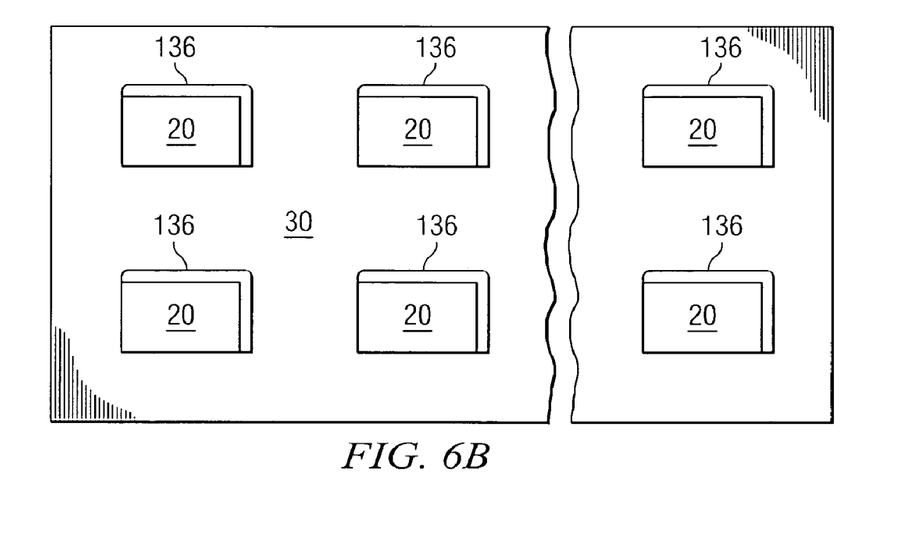

For example, as shown in FIG. 6(*a*), underfill resin 136 is supplied near the side surface of each semiconductor chip 20. Also, as shown in FIG. 6(*b*), underfill resin 136 may be supplied near the two edges of each semiconductor chip in accordance with the size of the semiconductor chip, the substrate spacing, the number of electrodes, and the electrode pitch. The quantity of underfill resin 136 supplied may be selected appropriately in accordance with the size of the semiconductor chip, the substrate spacing, etc.

As the temperature increases, the viscosity of underfill resin 136 decreases and the resin liquefies. As a result, the liquefied resin moves into the minute interior spaces between the substrate and the semiconductor chip due to capillary action. Since it is kept in vacuum chamber 132 for about 3 min, resin for underfill 136 can easily propagate to the spacing between semiconductor chip 20 and substrate 30 to fill almost completely with underfill resin 136. Because underfill resin 136 is supplied under a vacuum, the proportion of voids formed in the resin can be minimized.

The outlet port of vacuum chamber 132 is then opened, and the vacuum chamber is exposed to the atmosphere. It is preferred that the interior of vacuum chamber 132 be held at atmospheric pressure for about 10 sec. Vacuum chamber 132 is kept in the heated state by means of a heater. However, as the atmosphere enters, the temperature in vacuum chamber 132 drops, and, at the same time, the capillary action is accelerated, so that the underfill resin can completely enter deeply within the interior spaces between the semiconductor chip and the substrate. The temperature of the heater is then reduced, or the substrate is transported to unloader stage 140, so that underfill resin 136 can be cured.

Substrate 30 is then cut into dice for forming individual semiconductor devices 10, as shown in FIG. 1. In this way, because the underfill resin was injected under vacuum, the formation of voids due to air bubbles, etc. in the underfill resin can be minimized. As a result, the bonding strength between the bumps and electrodes with the flip-chip connection can be increased, and, due to the suppression of voids, the invasion of water, etc. into the interior from the outside can be effectively prevented. As a result, the connection strength and reliability of the electrodes in the flip-chip assembly can be improved.

The constitution of the semiconductor chip and substrate explained in the aforementioned embodiment is merely an example and the present invention is not thereby limited to it. For example, one may also adopt a scheme in which bumps 26 formed on principal surface 22 of semiconductor chip 20 are gold plated bumps or gold stud bumps. Also, the electrodes of the substrate may be made of gold.

In addition, bumps 26 of semiconductor chip 20 may be solder bumps or solder balls. The solder may be a lead-free type of Ag/Sn, etc. In this case, it is not necessary to have solder bumps for the electrodes of the substrate.

A polyimide substrate or a ceramic substrate may be used for substrate 30. Also, the substrate may have a laminated wiring structure. In addition, other types of resins besides epoxy resin may be used as the underfill resin. Also, when a multi-chip module is to be produced, a substrate with a plurality of semiconductor chips may be cut into multi-chip dice.

In the following, an explanation will be given regarding modified embodiments of the flip-chip connection. In the foregoing embodiments, the semiconductor device was a flip-chip assembly with semiconductor chip 20 as the bare chip assembled on substrate 30. However, instead of a semiconductor chip, a semiconductor package may also be used in the assembly.

Figure 7A:
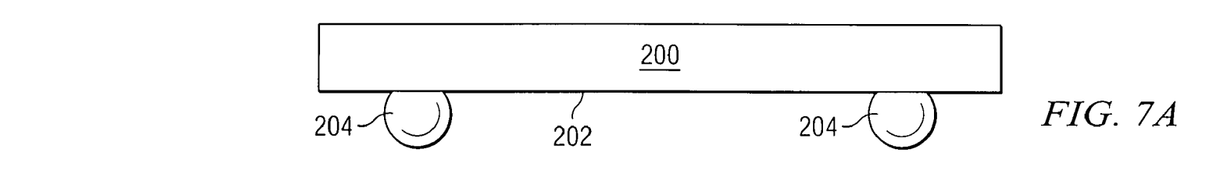
FIG. 7 is a diagram illustrating the configuration of another semiconductor device prepared using the manufacturing method of an embodiment of the present invention.
Figure 7B:
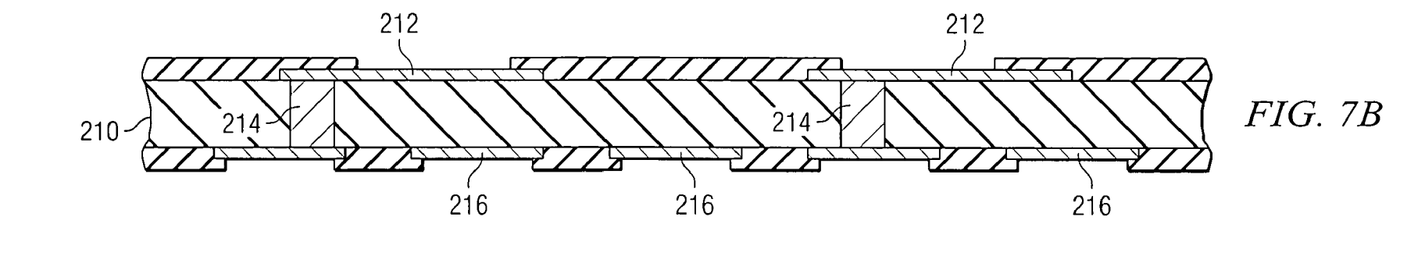
Figure 7C:
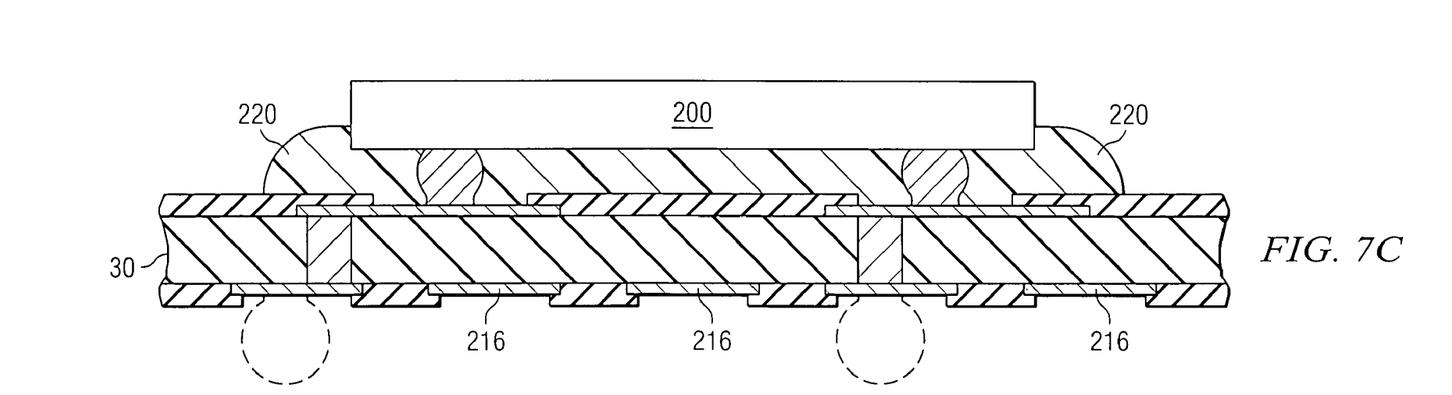

FIG. 7 is a cross-sectional view illustrating the structure when BGA, CSP or another semiconductor package 200 for surface mounting is assembled on substrate 210. Said semiconductor package 200 contains a plurality of external terminals 204 arranged in a two-dimensional configuration on inner surface 202 of the package. Said external terminals 204, for example, may be solder balls. Said external terminals 204 are connected to conductive lands 212 formed on the upper surface of substrate 210. The spacing between inner surface 202 of the package and substrate 210 is then filled with underfill resin 220. The filling with underfill resin 220 is performed in the vacuum chamber, as in the aforementioned embodiment.

External electrodes 216 of substrate 210 are connected via internal wiring 214 to conductive lands 212, and external terminals 204 of semiconductor package 200 are connected to conductive lands 212. Bumps, etc. are connected to external terminals 216 of substrate 210.

In this way, by filling the spacing between semiconductor package 200 and substrate 210 with the underfill resin in a vacuum atmosphere, it is possible to suppress the generation of voids in the underfill resin and to increase the bonding strength between the semiconductor package and the electrodes of the substrate.

Figure 8A:
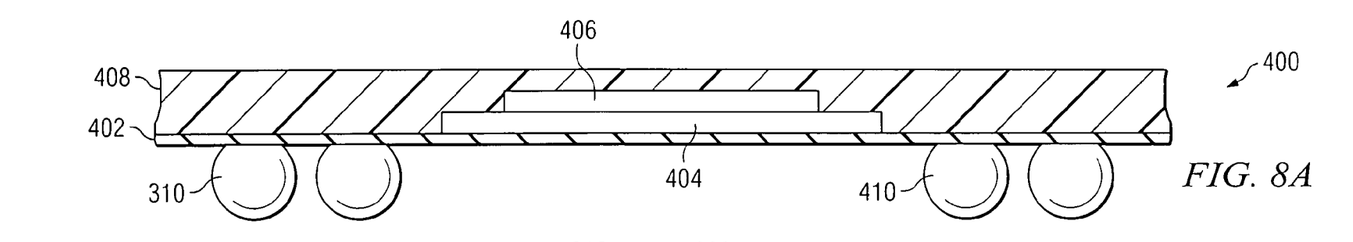
FIG. 8 is a diagram illustrating the constitution of another semiconductor device prepared using the manufacturing method of an embodiment of the present invention.
Figure 8B:
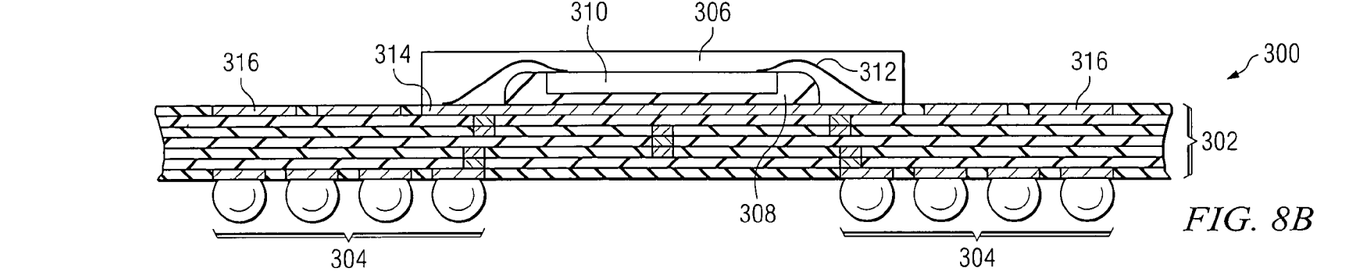
Figure 8C:
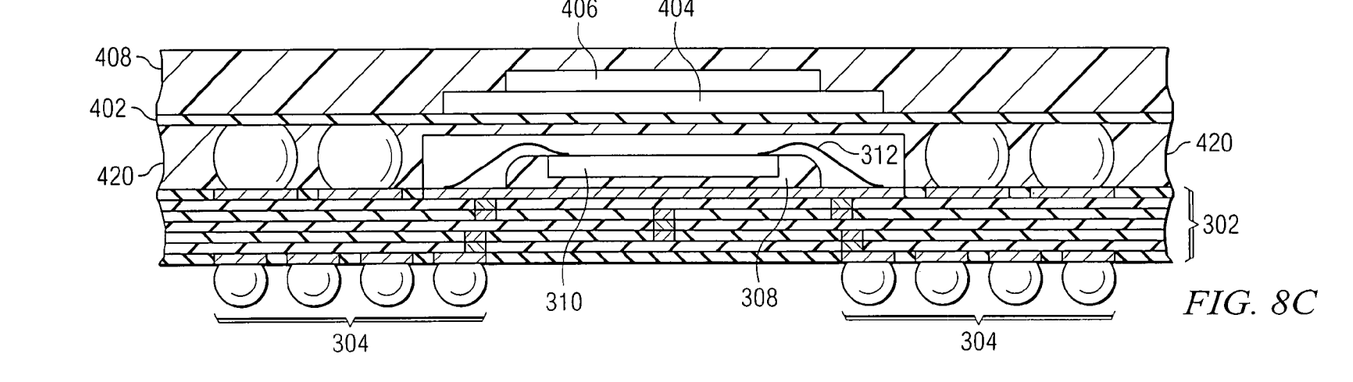

In addition, for the semiconductor device, one may also adopt a scheme in which another semiconductor package is carried on the semiconductor package to form a package-on-package (POP) structure. FIG. 8 is a cross-sectional view illustrating the semiconductor device with a POP structure in which one BGA package is stacked on another BGA package.

First semiconductor package 300 comprises laminated wiring substrate 302, a plurality of solder bumps 304 formed on the inner surface of laminated wiring substrate 302, and mold resin 306 formed on the upper surface of laminated wiring substrate 302. Semiconductor chip 310 is attached via die attachment 308 to the upper surface of substrate 302, and the electrodes of semiconductor chip 310 are connected to copper pattern 314 on the substrate by means of bonding wire 312. The region containing semiconductor chip 310 and bonding wire 312 is sealed with mold resin 306.

Second semiconductor package 400 is laminated on first semiconductor package 300. For example, second semiconductor package 400 contains semiconductor chips 404, 406 laminated on the upper surface of substrate 402, with said semiconductor chips 404, 406 sealed with mold resin 408. On the inner surface of substrate 402, two rows of solder balls 410 are formed on four sides.

When second semiconductor package 400 is mounted on first semiconductor package 300, solder balls 410 surround mold resin 306 and are connected to electrodes 316 formed on the upper surface of substrate 302. Then, the spacing between first semiconductor package 300 and second semiconductor package 400 is filled with underfill resin 420. As described above, the underfill resin is supplied in a vacuum chamber. As a result, it is possible to increase the bonding strength and to prevent breakage between solder balls 410 and electrodes 316 of the first and second packages.

A preferable embodiment of the present invention was explained above in detail. However, the present invention is not limited to this embodiment. For example, various modifications and changes may be adopted as long as the essence of the present invention as described in the claims is observed.

The semiconductor device manufacturing method of the present invention can be used in the surface mounting of semiconductor chips and semiconductor devices of small size, high density, and narrow pitch.

What is claimed is:

1. A semiconductor device manufacturing method comprising the following processing steps:
    connecting a plurality of electrodes, arranged in a two-dimensional array on a principal surface of a semiconductor chip, to corresponding conductive regions on a substrate;
    transporting the semiconductor chip connected to the substrate into a vacuum chamber;
    injecting an underfill resin onto the substrate from a side surface of the semiconductor chip in a vacuum atmosphere to fill a spacing between the semiconductor chip and the substrate;
    exposing the semiconductor chip and substrate with said supplied underfill resin to atmospheric pressure.

2. The manufacturing method described in claim 1, further comprising bringing the vacuum chamber to a vacuum level of 1 torr.

3. The manufacturing method described in claim 2, in which a plurality of semiconductor chips are mounted on the substrate, and that the underfill resin is supplied to each of said semiconductor chips.

4. The manufacturing method described in claim 1, in which the underfill resin is an epoxy resin, which is supplied after being heated to about 80-110° C.

5. The manufacturing method described in claim 4, in which the viscosity of the epoxy resin is about 0.2 Pa·s or lower.

6. The manufacturing method described claim 1, in which the spacing between the principal surface of the semiconductor chip and the substrate is 15 µm or less.

7. The manufacturing method described in claim 6, in which said bumps contain Au, Sn or Ag.

8. The manufacturing method described in claim 1, in which said plurality of electrodes include bumps connected to electrode pads on a principal surface of the semiconductor chip.

9. The manufacturing method described in claim 1, in which the pitch of said plurality of electrodes is 50 µm or less.

10. The manufacturing method described in claim 1, in which the conductive regions on the substrate include the bumps.

11. The manufacturing method described in claim 1, in which the substrate placed in the vacuum pressure is exposed to atmosphere for about 10 sec.

12. The manufacturing method described in claim 1, further comprising cutting the substrate into dice for each individual semiconductor chip after curing of the underfill resin.

13. A semiconductor device manufacturing method comprising the following processing steps:
    connecting a plurality of electrodes arranged in a two-dimensional array on a principal surface of a semiconductor package to corresponding conductive regions on a substrate;
    transporting the semiconductor package connected to the substrate into a vacuum chamber;
    injecting an underfill resin onto the substrate from a side surface of the semiconductor package in a vacuum atmosphere to fill a spacing between the semiconductor package and the substrate;
    exposing the semiconductor package and substrate with said supplied underfill resin to atmospheric pressure.

14. A semiconductor device manufacturing method comprising the following processing steps:
    connecting a plurality of electrodes, arranged in a two-dimensional array on a principal surface of a first semiconductor package, to corresponding conductive regions on a principal surface of a second semiconductor package;
    transporting the first semiconductor package connected to the second semiconductor package into a vacuum chamber;
    injecting an underfill resin onto the principal surface of the second semiconductor package from a side surface of the first semiconductor package in a vacuum atmosphere to fill a spacing between the first semiconductor package and the second semiconductor package;
    exposing the first and second semiconductor packages with said supplied underfill resin to atmospheric pressure.

* * * * *